United States Patent
Wang

(10) Patent No.: US 6,627,942 B2
(45) Date of Patent: Sep. 30, 2003

(54) SELF-ALIGNED FLOATING GATE POLY FOR A FLASH E2PROM CELL

(75) Inventor: Chih Hsin Wang, San Jose, CA (US)

(73) Assignee: Silicon Storage Technology, Inc, Sunnyvale, CA (US)

( * ) Notice: Subject to any disclaimer, the term of this patent is extended or adjusted under 35 U.S.C. 154(b) by 0 days.

(21) Appl. No.: 09/916,423

(22) Filed: Jul. 26, 2001

(65) Prior Publication Data

US 2002/0142544 A1 Oct. 3, 2002

Related U.S. Application Data

(60) Provisional application No. 60/280,313, filed on Mar. 29, 2001.

(51) Int. Cl.$^7$ .............................................. H01L 29/788
(52) U.S. Cl. ...................... 257/315; 257/317; 257/314
(58) Field of Search ................... 438/435, 437, 438/221, 296; 757/314–317

(56) References Cited

U.S. PATENT DOCUMENTS

| | | |
|---|---|---|
| 4,757,360 A | 7/1988 | Farone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,429,965 A | 7/1995 | Shimoji |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,008,108 A | * 12/1999 | Huang et al. |
| 6,091,104 A | 7/2000 | Chen |
| 6,103,573 A | 8/2000 | Harari et al. |
| 6,140,182 A | 10/2000 | Chen |
| 6,165,853 A | * 12/2000 | Nuttall et al. |
| 6,180,467 B1 | * 1/2001 | Wu et al. |
| 6,222,227 B1 | 4/2001 | Chen |
| 6,255,176 B1 | * 7/2001 | Kim et al. |
| 6,306,725 B1 | * 10/2001 | Nag et al. |

FOREIGN PATENT DOCUMENTS

EP 0 389 721 A2 10/1990

OTHER PUBLICATIONS

U.S. patent application Ser. No. 09/401,622, Johnson, filed Sep. 22, 1999.

* cited by examiner

Primary Examiner—Long Pham
(74) Attorney, Agent, or Firm—Gray Cary Ware & Friedenrich LLP

(57) ABSTRACT

Method and apparatus for isolating active regions in an electrically programmable and erasable memory device. A first layer of insulating material is formed on a substrate. A layer of conductive material is formed on the first layer of insulating material. A plurality of spaced apart trenches are formed through the first layer of insulating material, the layer of conductive material, and into the substrate. A second layer of insulation material is formed on sidewall portions of the trenches. A block of insulation material is formed in the trenches. For each of the trenches, an edge portion of the layer of conductive material extends over and overlaps with the first layer of insulating material and possibly a portion of the insulation material block by a predetermined distance Δ. For each of the trenches, the predetermined distance Δ is selected so that after back end processing is performed to the substrate and the conductive layer, the edge portion of the conductive layer is aligned to the sidewall portion of the isolation trench.

2 Claims, 2 Drawing Sheets

SELF-ALIGNED FLOATING GATE POLY FOR A FLASH E2PROM CELL

PRIORITY

This application claims the benefit of U.S. Provisional Application No. 60/280,313, filed Mar. 29, 2001, and entitled A Method forming a Self-Aligned Floating-Gate (FG) to the Active Region for Flash E2PROM Cell.

TECHNICAL FIELD

The present invention relates to a self-aligned method of forming a semiconductor memory array of floating gate memory cells, and more particularly to an improved method of forming the isolation regions between active regions in which the memory cells are formed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate, as well as the isolation regions between the active regions that contain these components. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of the isolation regions used in a semiconductor memory array, such as one with a floating gate memory cell type.

Figures FIGS. 1A–1B show the well known shallow trench process (STI) for forming isolation regions between active regions of a memory array semiconductor device. As shown in FIG. 1A, a first layer of insulation material 12, such as silicon dioxide ("oxide"), is formed on the substrate 10. A layer of polysilicon 14 (used to form the floating gate) is deposited on top of the layer of insulation material 12. A silicon nitride layer 16 ("nitride") is deposited over the polysilicon layer 14. A suitable photo-resistant material 18 is then applied on the silicon nitride layer 16 and a masking step is performed to selectively remove the photo-resistant material from certain regions (stripes 20). Where the photo-resist material 18 is removed, the silicon nitride 16, the polysilicon 14 and the underlying insulation material 12 are etched away in parallel stripes 20 using standard etching techniques (i.e. anisotropic etch process). The etching continues to form trenches 22 that extend down into the substrate 10. As the silicon substrate is etched to form trench 24, a slight lateral undercut 26 is formed, where the oxide layer 12 and poly layer 14 overhang the trench 22. Where the photo resist 18 is not removed, the silicon nitride 16, the first polysilicon region 14 and the underlying insulation region 12 are maintained.

The structure is further processed to remove the remaining photo resist 18, which is followed by the formation of an isolation material 24, such as silicon dioxide, in the trenches 22 (e.g. by depositing an oxide layer, followed by a CMP etch). Then, the nitride layer 18 is selectively removed. The resulting structure is shown in FIG. 1B. The remaining polysilicon layer 14 and the underlying first insulation material 12 form the active regions in which the memory cells are formed. Thus, at this point, the substrate 10 has alternating stripes of active regions and isolation regions with the isolation regions being formed of the shallow trench insulation material 24.

The structure in FIG. 1B represents a self aligned structure, which is more compact than a structure formed by a non self-aligned method. However, problems can occur with this structure after the isolation is completed and during the formation of the memory cells. FIG. 1C illustrates the structure after back processing steps are performed to complete the formation of the memory cell array structure. Poly layer loss is typical in such back processing steps, whereby the side edges of poly layer 14 that at one time extended over to overhang the isolation trench 22 are later are pulled back away from the isolation trench 22. This results in a gap 6 between the side edges of the poly layer 14 and the edges of the isolation trench 22, leaving a portion of oxide layer 12 and the substrate 10 exposed and unprotected by the poly layer 14. Several adverse consequences arise from this condition. First, this structure is prone to silicon pitting in the active region, where processing steps which rely on the protection by poly layer 14 tend to damage oxide layer 12 and substrate 10 in the gap region δ. Further, the electrical performance of the final product is adversely affected because the poly layer 14 (which forms the floating gate that controls conduction in the underlying substrate) no longer overlays the full width of the substrate 10 between adjacent isolation trenches. One further disadvantage of conventional STI isolation is that poly layer lifting occurs (i.e. smiling effect), which means the thickness of the oxide layer 12 near the side edges of the poly layer 14 increases. Poly layer lifting occurs because the poly layer 14 is formed before isolation trench oxide 24 is formed.

There is a need for an isolation process that addresses these problems.

SUMMARY OF THE INVENTION

The present invention solves the aforementioned problems by utilizing a process that self aligns the poly layer to the diffusion edge, where an increased overlap is formed between the side edges of the poly layer and the isolation regions. The process of the present invention can be independently optimized in a self-aligned manner.

The present invention is a self-aligned method of forming isolation and active regions in a semiconductor device, and includes the steps of forming a layer of first material on a semiconductor substrate, forming a plurality of spaced apart trenches that extend through the layer of first material and into the substrate, forming a first layer of insulating material along sidewall portions of the trenches, filling the trenches with an insulating material, removing the layer of first material to expose portions of the substrate, forming a second layer of insulating material on the exposed portions of the substrate, and forming a layer of conductive material on the second layer of insulating material.

In another aspect of the present invention, a semiconductor structure for use in the manufacture of an electrically programmable and erasable memory device includes a substrate of semiconductor material of a first conductivity type, a first layer of insulating material formed on the substrate, a layer of conductive material formed on the first layer of insulating material, a plurality of spaced apart trenches formed through the first layer of insulating material and the layer of conductive material and into the substrate, a second layer of insulation material formed on sidewall portions of the trenches, and a block of insulation material formed in the trenches. For each of the trenches, an edge portion of the layer of conductive material extends over and overlaps with the first layer of insulating material by a predetermined distance A.

Other objects and features of the present invention will become apparent by a review of the specification, claims and appended figures.

DETAILED DESCRIPTION OF THE PREFERRED EMBODIMENTS

Figure 1A:
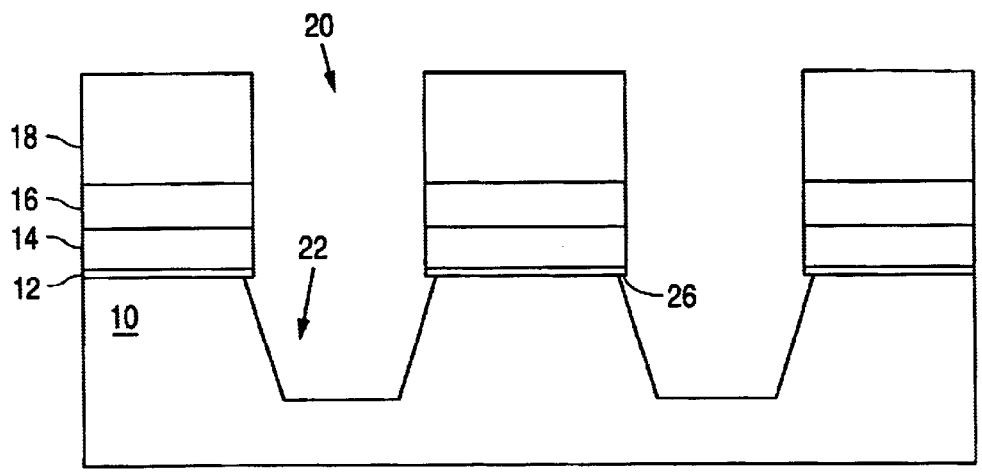
FIGS. 1A–1B are cross sectional views of a conventional method of forming isolation stripes in a semiconductor memory device.
Figure 1B:
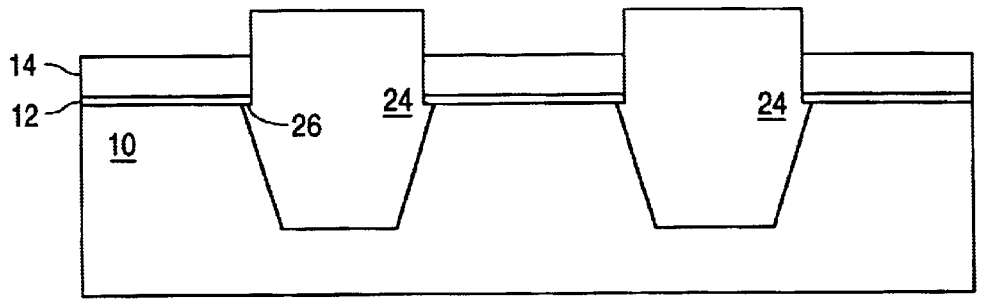
Figure 1C:
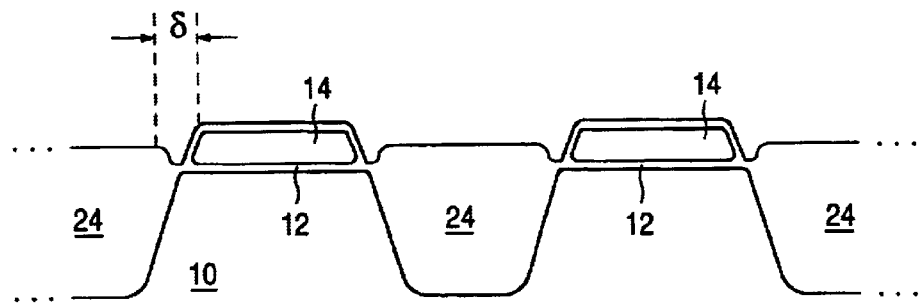
FIG. 1C is a cross sectional view of a semiconductor device formed using conventional isolation techniques, but after further back processing steps have taken place.
Figure 2A:
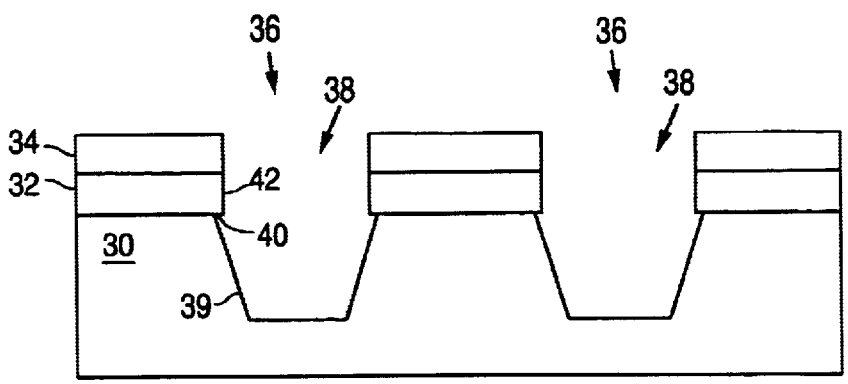
FIGS. 2A–2D are cross sectional views showing in sequence the next step(s) in the processing of a semiconductor device for the formation of isolation regions in a memory array semiconductor device.

The process of the present invention is illustrated in FIGS. 2A–2D, and starts with a semiconductor substrate 30 which is preferably of P type and is well known in the art. A silicon nitride layer 32 (hereinafter "nitride") is deposited over the silicon substrate 30, preferably by chemical vapor deposition (CVD). A suitable photo-resistant material 34 is applied on the nitride layer 32, and a masking step is performed to selectively remove the photo-resistant material from parallel stripe regions 36. Where the photo-resist material 34 is removed, the exposed stripes of nitride layer 32 are etched away using standard etching techniques (i.e. anisotropic etch process) to expose stripes of the underlying silicon substrate 30. A silicon etch process is then performed in the stripes 36 to form trenches 38 that extend through nitride layer 32 and into the silicon substrate 30. The trenches are originally defined by nitride edge 42 and sidewall portions 39 formed in the silicon substrate 30. The resulting structure is illustrated in FIG. 2A, and includes slight undercut portions 40 where the edges 42 of the nitride layer extend beyond trench sidewall portions 39 formed in the silicon substrate 30.

Figure 2B:
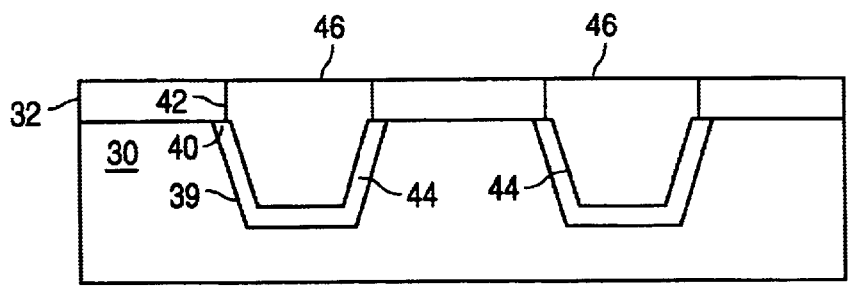

The structure is further processed to remove the remaining photo resist 34. Then, a linear oxidation process is performed to form oxide layers 44 along trench sidewall portions 39 in the substrate 30 by passivating the trench sidewall portions 39. This oxidation step further pushes the trench sidewall portions 39 laterally underneath the nitride layer 32, which increases the width of trenches 38 in substrate 10 and enhances the undercut portions 40 by creating a self aligned offset between the sidewall portions 39 and the adjacent edge 42 of the nitride layer 32. The trenches 38 are then filled with oxide to form oxide blocks 46 by conventional oxide deposition and planarization (e.g. CMP). The resulting structure is shown in FIG. 2B.

Figure 2C:
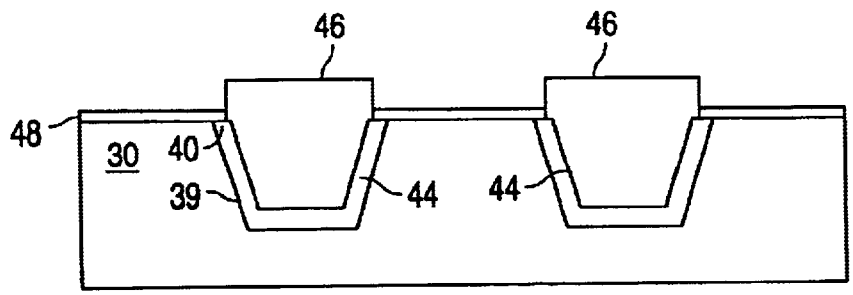

A nitride etch (wet or dry) process is performed to remove nitride layer 32. An insulating layer 48 is then formed on the exposed portions of the substrate 10. Preferably, insulating layer 48 is an oxide layer formed by oxide deposition (e.g. CVD) or by oxidizing the exposed surface of the substrate 30. The resulting structure is shown in FIG. 2C.

Figure 2D:
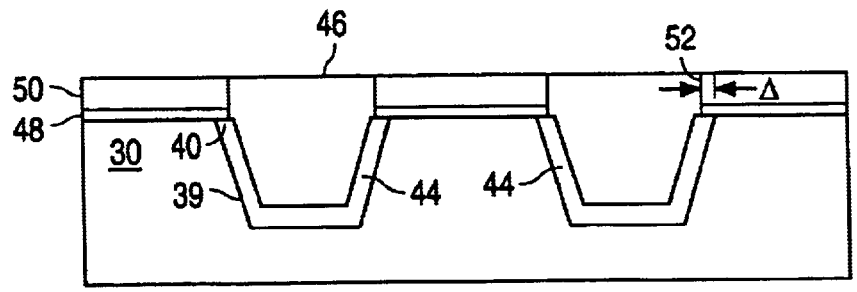

A conductive layer 50 is then formed over the insulating (oxide) layer 48 so that its top surface is even with the top surface of trench oxide 46. In the preferred embodiment, the conductive layer is formed by a polysilicon deposition process, followed by CMP planarization. The resulting structure is shown in FIG. 2D.

The isolation regions are now defined by the combination of the oxide blocks 46 and the oxide layers 44. There is an enhanced overlap distance Δ in which the edge 52 of conductive layer 50 overlaps with the isolation region (i.e. oxide layer 44). The size of this overlap distance Δ is dictated primarily by the thickness of the oxide layer 44 formed in the isolation trenches 38, which is controllable. Thus, the overlap distance Δ can be independently optimized in a self-aligned manner to provide an enhanced overlap that counteracts the poly layer loss during later back end processing, so that the edges of poly layer 50 are better aligned to the edges of the isolation regions once all processing steps are completed. Further, since the poly layer 50 is formed after the formation of trench oxide 46, insulating oxide 48 and oxide layers 44, poly lifting is avoided.

It is to be understood that the present invention is not limited to the embodiment described above and illustrated herein, but encompasses any and all variations falling within the scope of the appended claims. For example, although the foregoing method describes the use of polysilicon as the conductive material, and nitride and oxide as insulation materials, it should be clear to those having ordinary skill in the art that any appropriate conductive material and insulation materials can be used. In addition, the thickness of oxide layer 44 can be less than the length of overhang portion 40, whereby the edge 52 of conductive layer 50 will also partially extend over and overlap with a portion of corresponding oxide block 46.

What is claimed is:

1. A semiconductor structure for use in the manufacture of an electrically programmable and erasable memory device, comprising:

a substrate of semiconductor material of a first conductivity type;

a first layer of insulating material formed on the substrate;

a layer of conductive material formed on the first layer of insulating material;

a plurality of spaced apart trenches extending through the first layer of insulating material, the layer of conductive material, and into the substrate:

a second layer of insulation material formed on sidewall portions of the trenches; and a block of insulation material formed in the trenches;

wherein for each of the trenches, an edge portion of the layer of conductive material extends over and overlaps with the second layer of insulating material by a predetermined distance Δ; and wherein for each of the trenches, the edge portion of the layer of conductive material further extends over and overlaps with a portion of the block of insulation material.

2. A semiconductor structure for use in the manufacture of an electrically programmable and erasable memory device, comprising:

a substrate of semiconductor material of a first conductivity type;

a first layer of insulating material formed on the substrate;

a layer of conductive material formed on the first layer of insulating material;

a plurality of spaced apart trenches extending through the first layer of insulating material, the layer of conductive material, and into the substrate;

a second layer of insulation material formed on sidewall portions of the trenches; and a block of insulation material formed in the trenches;

wherein for each of the trenches, an edge portion of the layer of conductive material extends over and overlaps with the second layer of insulating material by a predetermined distance $\Delta$; and wherein for each of the trenches, the predetermined distance $\Delta$ is selected so that after back end processing is performed to the substrate and the conductive layer, the edge portion is substantially aligned to the sidewall portion of the trench.

* * * * *